United States Patent [19]

Kennan

[11] Patent Number: 4,595,881
[45] Date of Patent: Jun. 17, 1986

[54] DISTRIBUTED AMPLIFIER USING DUAL-GATE GAAS FET'S

[75] Inventor: Wayne Kennan, Palo Alto, Calif.

[73] Assignee: Avantek, Inc., Santa Clara, Calif.

[21] Appl. No.: 738,865

[22] Filed: May 29, 1985

[51] Int. Cl.$^4$ .............................................. H03F 3/60
[52] U.S. Cl. ...................................... 330/54; 330/277; 330/286
[58] Field of Search .................. 330/53, 54, 277, 278, 330/279, 284, 286, 287

[56] References Cited

U.S. PATENT DOCUMENTS 4,486,719  12/1984  Ayasli ........................... 330/54 X
4,540,954  9/1985   Apel ............................. 330/54 X Primary Examiner—Eugene R. LaRoche
Assistant Examiner—Steven J. Mottola
Attorney, Agent, or Firm—Philip M. Shaw, Jr.

[57] ABSTRACT

A 2-18 gigahertz monolithic distributed amplifier using dual-gate gallium arsenide field effect transistors for maximum gain over the design bandwidth.

4 Claims, 6 Drawing Figures

SCHEMATIC DIAGRAM OF THE DISTRIBUTED AMPLIFIER

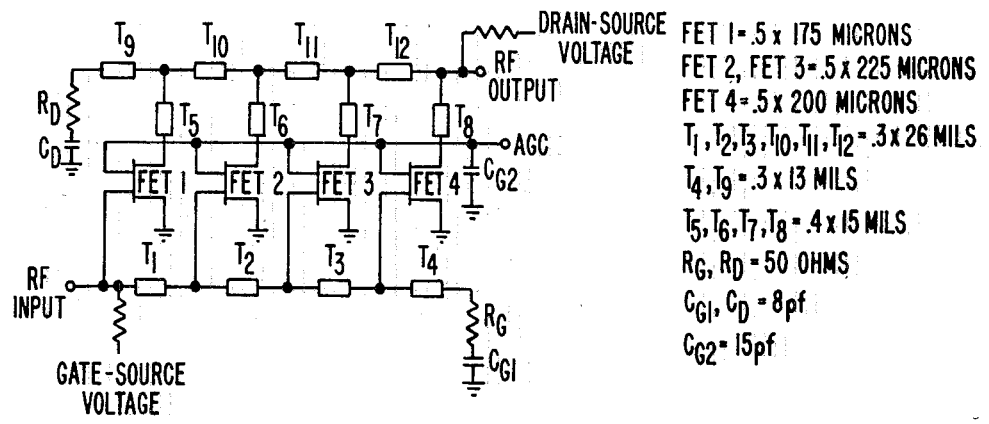
SCHEMATIC DIAGRAM OF THE DISTRIBUTED AMPLIFIER
FIG._1.
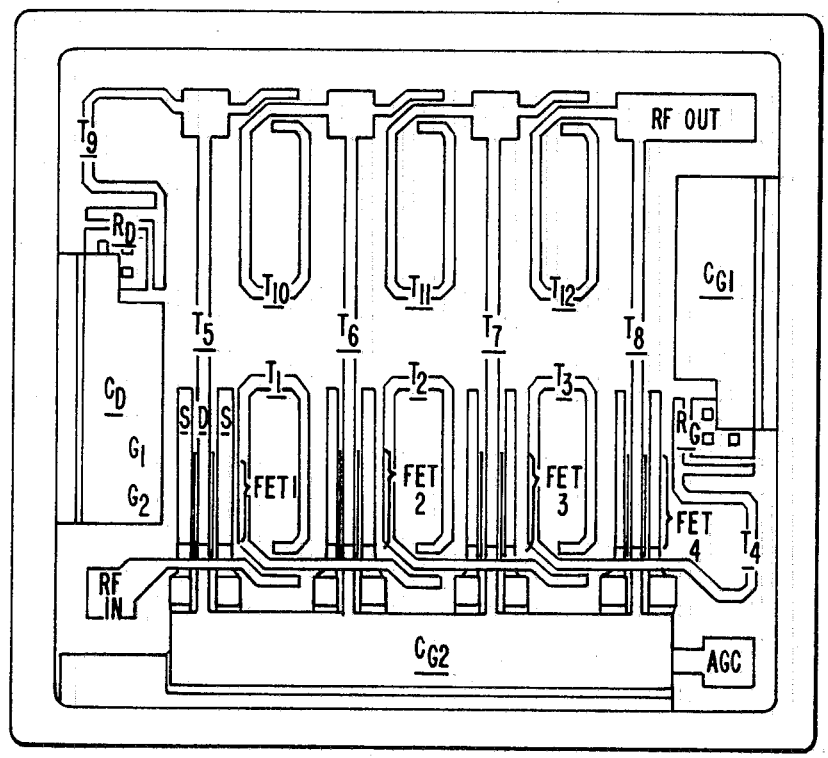
FIG._2.

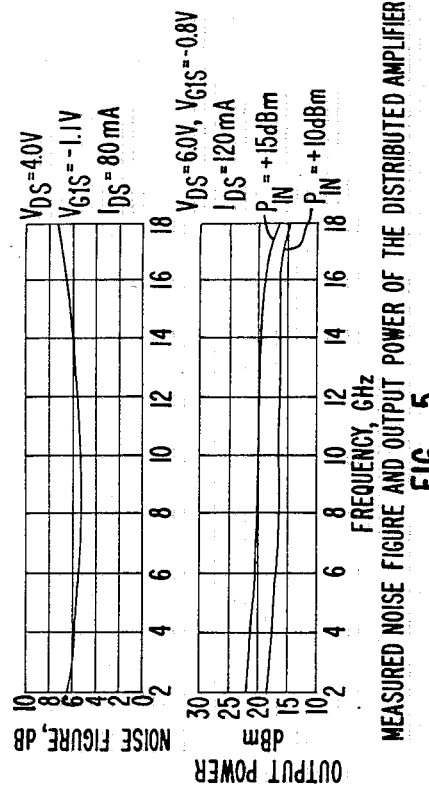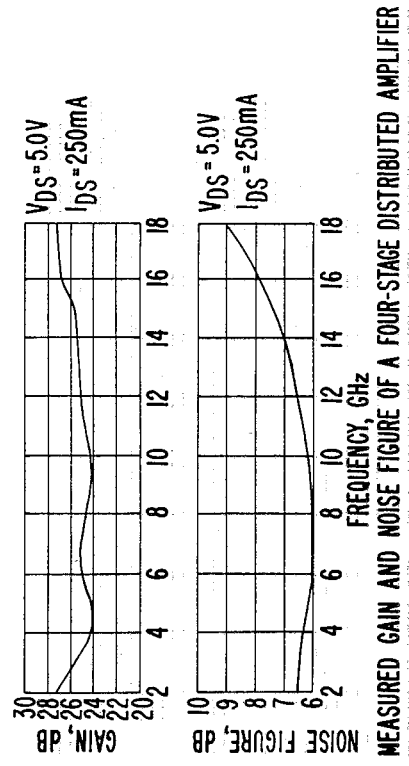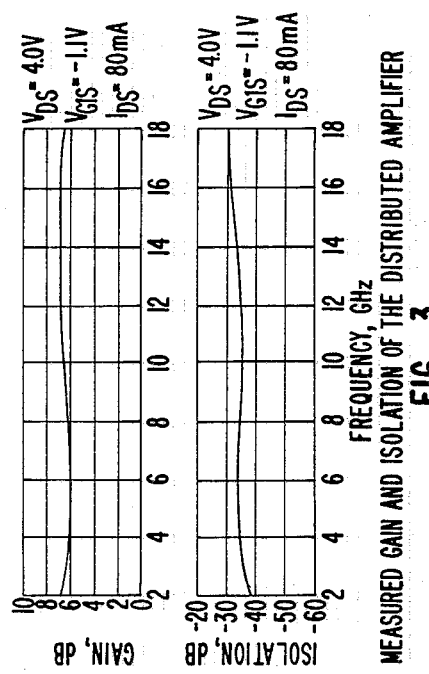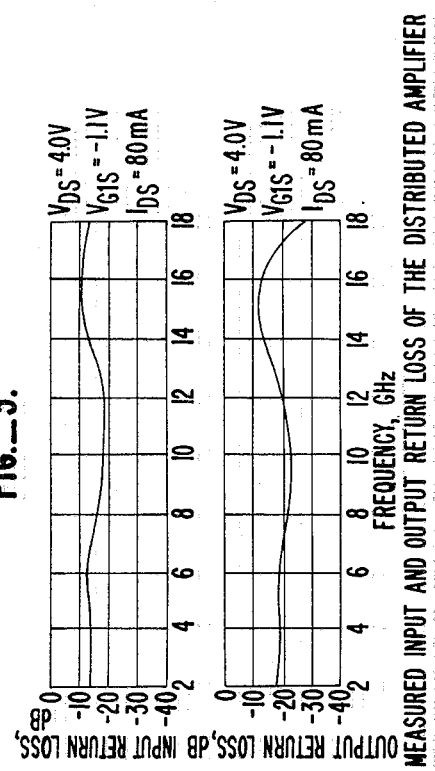

DISTRIBUTED AMPLIFIER USING DUAL-GATE GAAS FET'S

DESCRIPTION

1. Technical Field

This relates to electronic amplifiers and, more particularly, to a distributed amplifier.

2. Background Art

In the past several years, distributed amplification has enjoyed a renaissance due to the gallium arsenide field effect transistor (GaAs FET). Applied originally to electron tubes, this amplification technique has the unique capability of adding device transconductance without adding device parasitic capacitance. This is accomplished by linking the parasitic shunt capacitance of the devices with series inductors to form an artificial low-pass transmission line. By terminating these links with resistive loads, the unwanted signals are dissipated while the desired signals are added in-phase at the output of the amplifier. The result is unprecedented gain bandwidth product with flat gain and low VSWR.

Previous attempts at distributed amplification used single-gate devices. Such devices, although quite feasible, do not have sufficiently high isolation and output impedance. High reverse isolation is desirable for high amplifier isolation and can limit an amplifier's bandwidth. The output impedance of an amplifier can control the flatness of the gain and the output VSWR. A relatively low output impedance would place a significant load on the drain transmission line. At low frequencies, where the output resistances of the devices are virtually in parallel, a 4-section design would result in a 62.5 ohm resistive load on the 50 ohm impedance transmission line.

Yet another problem of prior art designs is that they require excessive lengths for the device to provide for the appropriate inductances.

SUMMARY OF THE INVENTION

The above and other problems of prior art distributed amplifiers are overcome by the present invention of a distributed amplifier comprising a radio frequency input terminal, a radio frequency output terminal, a circuit ground, an automatic gain control input terminal for receiving a gain control signal, and at least a pair of dual gate field effect transistors, each having first and second gate electrodes and source and drain electrodes. A plurality of first inductances are connected together in series, one end of the series connection being connected to the input terminal. A first resistor and a first capacitor are connected together in series between the circuit ground and the other end of the series connection of the first inductances.

A plurality of second inductances are connected in series, with one end of the connection of the second inductances being connected to the output terminal. A second resistor and a second capacitor are connected in series between the circuit ground and the other end of the series connection of the second inductances. The source electrodes are all connected to the circuit ground. The second gate electrodes are all connected to the gain control input.

The first gate electrode of a first one of the field effect transistors is connected to the input terminal and the first gate electrodes of the remaining field effect transistors are each connected to the junction connections between different ones of the first inductances. The drain electrode of a last one of the field effect transistors is connected in series with a separate one of a plurality of third inductances to the output terminal, and the drain electrodes of the remaining field effect transistors are all connected in series with different ones of the third inductances to different junction connections of the series connection of the second inductances.

As will be explained in detail further herein, the dual-gate FET distributed amplifier design of the present invention provides a higher isolation and output impedance than previous single gate FET such amplifiers, the total gate width is distributed among the individual devices for optimal design characteristics, and the length is minimized by the use of single turn inductors and a wraparound ground.

It is therefore an object of the present invention to provide a distributed amplifier, using gallium arsenide field effect transistors, which amplifier has higher isolation and output impedance compared to prior art devices.

It is another object of the invention to provide a distributed amplifier using dual-gate gallium arsenide FET's in which distribution of the total gate width is among the individual devices.

It is yet a further object of the invention to provide a distributed amplifier using gallium arsenide FET's which requires a relatively small area.

These features and advantages of the present invention will become more apparent upon a perusal of the following specification taken in conjunction with the accompanying drawings wherein similar characters of reference refer to similar structures in each of the separate views.

BRIEF DESCRIPTION OF THE DRAWINGS

FIG. 1 is a schematic diagram of the distributed amplifier according to the invention;

FIG. 2 is an illustration of a scanning electron micrograph of the amplifier according to the invention;

FIG. 3 are graphs illustrating the measured gain and isolation of the amplifier according to the invention;

FIG. 4 are graphs illustrating the measured input and output return losses of the distributed amplifier according to the invention;

FIG. 5 are graphs illustrating the measured noise figure and output power of the amplifier according to the invention; and FIG. 6 are graphs illustrating the measured gain and noise figure of a 4-stage distributed amplifier according to the invention.

BEST MODE FOR CARRYING OUT THE INVENTION

The topology of the 2-18 gigahertz distributed amplifier according to the invention is shown in FIG. 1 and a microphotograph of the actual device appears in FIG. 2. A series of field effect transistors labelled FET 1, 2, 3, and 4, respectively, have their source electrodes connected to the circuit ground. All of the second gate electrodes are connected together to an automatic gain control (AGC) terminal. This AGC terminal is connected to the circuit ground through a bypass capacitor $C_{g2}$. A circuit of series connected coils T1, T2, T3, and T4 are connected between a radio frequency (RF) input terminal and a series connection of a resistance $R_g$ and a capacitor $C_{g1}$ to the circuit ground.

The first gate electrode of the FET 1 is connected to the radio frequency (RF) input terminal. The first gate electrode of the FET 2 is connected to the junction point between coil T1 and coil T2. The first gate electrode of FET 3 is similarly connected to the junction point between coil T2 and the coil T3 and the first gate electrode of FET 4 is connected between T3 and T4.

A radio frequency (RF) output terminal is connected through a series connection of coils T12, T11, T10, and T9, and a series connection of a resistance $R_D$ and capacitance $C_D$, to the circuit ground. The drain electrodes of the FET's 1, 2, 3, and 4 are connected through separate coils T5, T6, T7, and T8, respectively, to the nodes between the coils T9, T10, T11, T12, and the RF output terminal, respectively.

In this design, there are essentially three features which distinguish it from previous distributed amplifiers. First and most important, the design uses dual-gate GaAs FET's in place of the more traditional single-gate devices. The contribution of dual-gate FET's to distributed amplification is equivalent to that of cascode-connected single-gate devices. The dual-gate FET, which is in fact modeled as a cascode connection of single-gate FET's, has an input impedance comparable to single-gate devices but much higher isolation and output impedance. High reverse isolation in the device is necessary for high amplifier isolation and often extends the amplifier's bandwidth. High device output impedance, on the other hand, improves gain flatness and output voltage to standing wave ratio (VSWR), and increases gain. This is because singe-gate FET's output resistance is relatively low (250 Ω for a 250-μm device) and a significant load on the drain transmission line.

At low frequencies where the output resistances of the devices are virtually in parallel, a four-section design would result in a 62.5-Ω resistive load on the 50-Ω impedance transmission line. This problem is completely eliminated with the dual-gate (or cascode-connected) device.

The second feature of this design is the distribution of total gate width among the individual devices. In order to achieve a minimum gain of 7 dB with some prior art devices and 8-μm cm-wide transmission lines, which are fairly lossy, the amplifier requires at least 800 μm of gate width. This gate width could be theoretically partitioned into nearly any number of sections, but four sections prove optimal in many respects. First, it was desired to absorb the input and output bond wires into the distributed amplifiers input and output L/2 sections. For an input and output impedance of 50 Ω with 0.3-nH bond wires, this means $$\sqrt{L/C} = 50 \text{ or } C = L/2500 = 0.3 \text{ nH}/1250 = 0.24 \text{ pF}$$

This capacitance corresponds to a device gate width of 250 μm, but a choice of 200 μm leaves margin for error and the shunt capacitance of the high impedance transmission lines. Secondly, the four-section design offers a good compromise in gain flatness, VSWR, and noise figure over other 800-μm designs. This was determined by simulating the alternatives with a microwave analysis program. The four-section design is also more area efficient than its alternatives and results in a nearly square chip for ease of handling. As a final touch, the four individual device gate widths were optimized for VSWR and gain flatness. As shown in FIG. 2, the first and last sections are smaller than the two internal devices. This is primarily to absorb the parasitic capacitance of the input and output bonding pads.

The third feature of the design is its small area. At 0.75 mm×0.85 mm the chip area is 0.64 mm$^2$, which yields a potential of over 2500 amplifiers per 2-indiam wafer. This is chiefly a result of the single-turn inductors T1, T2, T3, T10, T11, and T12 and wraparound ground, best illustrated in FIG. 2. The single-turn inductor is modeled with lengths of coupled transmission line to account for coupling between the two major lengths and coupling the FET sources (ground). If these inductors were laid out in a straight line rather than coiled one turn, the chip height would be unchanged at 0.75 mm but its length would be increased by 1.5 mm to 2.35 mm. The resulting layout would occupy nearly three times the area of the present one. The wraparound ground is also helpful in reducing chip area since the perimeter of the chip is normally not used. Via-hole grounds, on the other hand, require prime chip area and may be significant in size.

The amplifier contains three capacitors which are used for RF bypass to ground. CG1 and CD are used to bypass radio frequency signals to ground at the input and output terminating resistors, respectively, so that dc power is not dissipated in these elements. The third capacitor, CG2, is used to bypass the second gates of the dual-gate FET's. This provides isolation from external dc circuitry and ensures that the dual-gate FET operates as a cascode circuit. The FET sources are all grounded, thus requiring two external bias voltages—one positive for the drain and one negative for the gate.

In fabrication, ion-implanted GaAs is used as the starting material for IC's due to its excellent uniformity and controllability. After implantation, the wafers are annealed at 800° C. until the active layer sheet resistance drops to approximately 500 Ω/square. This layer is then selectively etched to form mesas for the FET's and resistors. Later, the resistor mesas are trimmed to 800 Ω/square with a process that is controllable to a standard deviation of 15 percent.

The FET's in the IC are fabricated with the same process traditionally used for discrete FET's. The gates are formed on a nominally 0.5-μm-long base of TiW-/Au, which is gold-plated to 0.7 μm. The resulting structure achieves very short gate length with large gate cross-sectional area for high device transconductance with low parasitic capacitance and resistance. Source and drain ohmic contacts are formed with a AuGe/Ni/Au alloy.

Parallel-plate dielectric capacitors and surface passivation are provided by a thin layer of plasma-enhanced chemical vapor deposited (CVD) silicon nitride. This process achieves a capacitance density of 390 pF/mm$^2$ with a standard deviation of less than 40 pF/mm$^2$.

Metallic interconnections are achieved with a two-level wiring process which provides surface connections, cross-overs, and air bridges. The top level is situated 3 μm above the GaAs surface and is gold-plated to 1.5 μm. The bottom level rests directly on the semi-insulating substrate and is 0.8 μm thick. For additional thickness, the top level is deposited directly on the bottom level to achieve a thickness of 2.3 μm. These lines are designed for a dc current density not to exceed $5 \times 10^5$ amps/cm$^2$.

Wraparound ground technology is chosen over via-hole ground technology for low parasitic inductance and improved area efficiency. To form the wraparound ground, metal is first deposited and gold-plated to 2 μm thickness on the front side of the chips. The wafer is then lapped to 115 μm and backside metallized to complete the wraparound ground connection.

Before backside-lapping and die-separation, the GaAs wafer is stepped and dc-probed for saturated current, pinchoff voltage, and transconductance. Devices which are open-circuited, short-circuited, or otherwise fail the dc test are identified with an ink spot and later discarded. Data on passed devices is presented in summary form and may also be formatted into histograms for statistical analysis. The chips are then separated, visually inspected, and prepared for assembly into packages and thin-film hybrid circuits.

For RF evaluation, the amplifiers are mounted on 15-mil-thick alumina substrates. The substrate includes 50-Ω transmission lines, bias resistors, and plated through slots for ground. The data reported in this application was measured on IC's mounted on the substrate with input and output bonding wires and no tuning. Bias was injected through external bias tee's.

FIG. 3 shows gain and isolation measured on a typical amplifier fabricated within process specifications. The gain is 6.3 dB plus or minus 0.5 dB with greater than 25-dB isolation. FIG. 4 shows input and output return loss for the same chip. The worst case VSWR is 2.0:1 although it is less than 1.5 over most of the band. The device is biased at 4.0-V VDS, 80-mA IDS, which is half the saturated current level. Higher gain may be achieved with increased drain current, but gain flatness degrades slightly.

Noise and power performance are illustrated in FIG. 5. Noise figure is typically less than 6 dB and rises to 7.5 dB at 18 GHz. This can be reduced with an adjustment in bias but with a corresponding loss in associated gain. Output power is plotted from 2–18 GHz with constant input power levels of 10 dBm and 15 dBm. The device is capable of 20-dBm power over most of the band, but it degrades to 17 dBm at 18 GHz. Gain compression is more severe at the higher frequencies, as can be determined from the two plots.

Cascaded performance is demonstrated in FIG. 6. This data was measured on a four-stage amplifier consisting of two alumina substrates, four IC's, and ten bypass capacitors. The amplifier includes bias circuitry and measures only 5.1 mm×12.7 mm×0.38 mm. This assembly shows that, even without integrating the blocking capacitors and bias circuitry on chip, a linear gain density of 50 dB per inch is easily achieved over the full 2–18-GHz band. With more compact hybrid layouts, this number could easily double.

As an AGC amplifier, gain variation is very flat over the full 2–18 GHz range when gate 2 voltage (at the AGC input terminal) is varied between 0 V and −1 V. When the gate 2 voltage is made more negative, the amplifier becomes lossy and may be used as a limiter. Finally, when the voltage is increased to −4 V, the drain current drops to nearly zero and the amplifier provides over 25-dB isolation. This property could be used in switching applications since VSWR and reverse isolation remain less than 2:1 and greater than 25 dB, respectively, under all bias conditions.

A 2–18-GHz monolithic GaAs distributed amplifier with over 6-dB gain has been described. The dual-gate FET distributed amplifiers according to the invention have the advantages over prior art single-gate FET distributed amplifiers, of more gain with better flatness, VSWR, and bandwidth. This is demonstrated in a four-stage amplifier which achieved 25.5-dB plus or minus 1.5 dB gain from 2–18 GHz. The dual gate FET distributed amplifier may also be used for many control functions by adjusting the gate 2 voltage at the AGC input terminal.

The terms and expressions which have been employed here are used as terms of description and not of limitations, and there is no intention, in the use of such terms and expressions, of excluding equivalents of the features shown and described, or portions thereof, it being recognized that various modifications are possible within the scope of the invention claimed.

What is claimed is:

1. A distributed amplifier comprising a radio frequency input terminal, a radio frequency output terminal, a circuit ground, an automatic gain control input terminal for receiving a gain control signal, at least a pair of dual gate field effect transistors, each having first and second gate electrodes and source and drain electrodes, a plurality of first inductances connected together in series, one end of the series connection being connected to the input terminal, a first resistor and a first capacitor connected together in series between the circuit ground and the other end of the series connection of the first inductances, a plurality of second inductances connected in series, the series connection of second inductances being connected at one end to the output terminal, a second resistor and a second capacitor connected in series between the circuit ground and the other end of the series connection of the second inductances, a plurality of third inductances, and wherein the source electrodes are connected to the circuit ground, the second gate electrodes are connected to the gain control input, the first gate electrode of a first one of the field effect transistors is connected to the input terminal and the first gate electrodes of the remaining field effect transistors are each connected to the junction connections between different ones of the first inductances, the drain electrode of a last one of the field effect transistors is connected in series with one of the third inductances to the output terminal, and the drain electrodes of the remaining field effect transistors are connected in series with different ones of the third inductances to different junction connections of the series connection of the second inductances.

2. An amplifier as recited in claim 1 wherein the field effect transistors are of the gallium arsenide type.

3. An amplifier as recited in claim 1 further comprising a third capacitor connected between the gain control input and the circuit ground.

4. An amplifier as recited in claim 1 wherein the number of field effect transistors and first, second and third inductances so connected is four.

* * * * *